United States Patent
Lee

(10) Patent No.: US 9,627,405 B1
(45) Date of Patent: Apr. 18, 2017

(54) SEMICONDUCTOR DEVICE AND MANUFACTURING METHOD THEREOF

(71) Applicant: SK hynix Inc., Icheon-si, Gyeonggi-do (KR)

(72) Inventor: Hee Youl Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/259,380

(22) Filed: Sep. 8, 2016

(30) Foreign Application Priority Data

Mar. 31, 2016 (KR) .......................... 10-2016-0039150

(51) Int. Cl.
| | | |
|---|---|---|
| *H01L 27/115* | (2006.01) | |
| *H01L 27/11582* | (2017.01) | |
| *H01L 29/08* | (2006.01) | |
| *H01L 29/10* | (2006.01) | |
| *H01L 27/11578* | (2017.01) | |
| *H01L 27/1158* | (2017.01) | |

(52) U.S. Cl.
CPC .... *H01L 27/11582* (2013.01); *H01L 27/1158* (2013.01); *H01L 27/11578* (2013.01); *H01L 29/0847* (2013.01); *H01L 29/1037* (2013.01)

(58) Field of Classification Search
CPC ... H01L 27/11563–27/11582; H01L 29/66833; H01L 29/66666; H01L 21/28282
See application file for complete search history.

(56) References Cited

U.S. PATENT DOCUMENTS

| | | | | |
|---|---|---|---|---|
| 8,390,054 | B2 * | 3/2013 | Ino ........................ | B82Y 10/00 257/315 |
| 8,829,598 | B2 * | 9/2014 | Lim .................. | H01L 27/11578 257/324 |
| 9,129,857 | B2 * | 9/2015 | Kim .................... | H01L 27/1157 |
| 2014/0151774 | A1 | 6/2014 | Rhie | |
| 2015/0162342 | A1 * | 6/2015 | Lee .................. | H01L 27/11582 257/324 |
| 2016/0163729 | A1 * | 6/2016 | Zhang ............... | H01L 27/11582 257/321 |
| 2016/0240552 | A1 * | 8/2016 | Arai .................... | H01L 27/1157 |

FOREIGN PATENT DOCUMENTS

KR         1020120128438 A         11/2012

\* cited by examiner

*Primary Examiner* — Jose R Diaz
(74) *Attorney, Agent, or Firm* — William Park & Associates Ltd.

(57) ABSTRACT

A semiconductor device may include a multi-layered source layer, conductive patterns, interlayer insulating layers, and a channel pillar. The multi-layered source layer may include a lower source layer, an interlayer source layer, and an upper source layer. The conductive patterns and interlayer insulating layers may be alternately disposed on the multi-layered source layer. The channel pillar may penetrate the conductive patterns. The interlayer insulating layers, the upper source layer, and the interlayer source layer, the channel pillar may extend into the lower source layer. The channel pillar may be in contact with the interlayer source layer. Doped regions having various structures can be formed at a lower portion of the channel pillar, thereby improving the operational reliability of the semiconductor device.

9 Claims, 13 Drawing Sheets

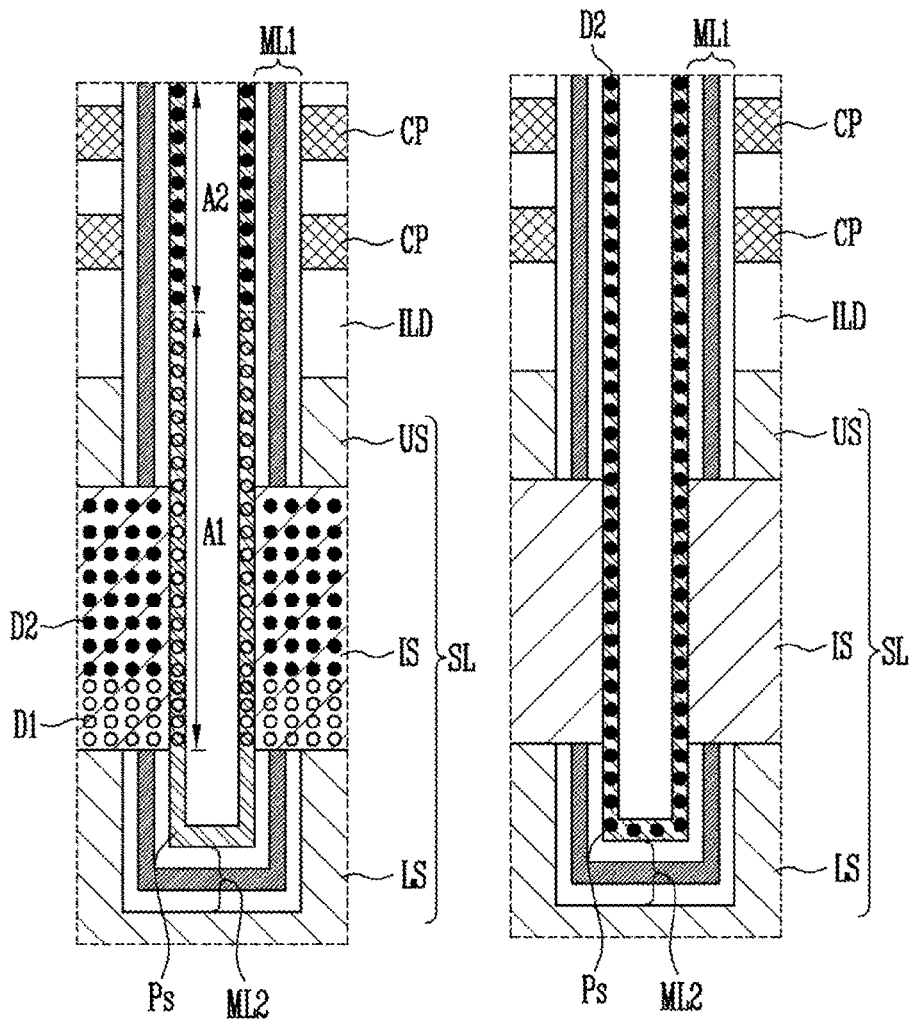

SEMICONDUCTOR DEVICE AND MANUFACTURING METHOD THEREOF

CROSS-REFERENCE TO RELATED APPLICATION

The present application claims priority under 35 U.S.C. §119(a) to Korean patent application number 10-2016-0039150 filed on Mar. 31, 2016, the entire disclosure of which is incorporated herein by reference.

BACKGROUND

1. Technical Field

An aspect of the present disclosure generally relates to a semiconductor device and a manufacturing method thereof, and more particularly to a semiconductor device including a channel pillar and a manufacturing method thereof.

2. Related Art

Semiconductor devices may be manufactured as integrated circuits. Examples of such integrated circuits may include a semiconductor memory device having a plurality of memory cells capable of storing data therein. The plurality of memory cells may be arranged in a three-dimensional pattern on top of the semiconductor substrate. For example, the plurality of memory cells may be stacked along a channel pillar disposed on the substrate, thereby forming a three-dimensional memory device.

A three-dimensional semiconductor memory device is well-suited for attaining a high integration density. The three-dimensional semiconductor memory device may perform an erase operation by generating gate induced drain leakage (GIDL) current. Recently, various techniques for improving the operational reliability of the three-dimensional semiconductor memory device are being developed.

SUMMARY

According to an aspect of the present disclosure, there is provided a semiconductor device including a multi-layered source layer, conductive patterns, interlayer insulating layers, and a channel pillar. The multi-layered source layer may include a lower source layer, an interlayer source layer, and an upper source layer. The conductive patterns and interlayer insulating layers may be alternately disposed on the multi-layered source layer. The channel pillar may penetrate the conductive patterns, the interlayer insulating layers, the upper source layer, and the interlayer source layer. The channel pillar may extend into the lower source layer. The channel pillar may be in contact with the interlayer source layer.

The channel pillar may include a first doped region and a second doped region. The first doped region may overlap the interlayer source layer and include a first dopant. The second doped region may overlap at least one layer from the lowermost layer among the conductive patterns and include a second dopant.

Alternatively, the channel pillar may include a doped region overlapping the interlayer source layer and at least one layer from the lowermost layer among the conductive patterns, and a memory cell channel region disposed over the doped region, the memory cell channel region having a lower threshold voltage than the doped region.

According to an aspect of the present disclosure, there is provided a method of manufacturing a semiconductor device. The method may include sequentially stacking a lower source layer including a first dopant, a sacrificial layer, and an upper source layer including a second dopant. The method may include alternately stacking first material layers and second material layers on the upper source layer. The method may include forming channel pillars penetrating the first material layers, the second material layers, the upper source layer, and the sacrificial layer. The channel pillars may extend into the lower source layer. The method may include forming, between the channel pillars, a slit penetrating the first material layers, the second material layers, and the upper source layer, the slit exposing the sacrificial layer therethrough. The method may include exposing the channel pillars by removing the sacrificial layer through the slit. The method may include forming the interlayer source layer being in contact with the channel pillars, the lower source layer, and the upper source layer inside a region from which the sacrificial layer is removed. The method may include diffusing the first and second dopants from the lower source layer and the upper source layer into the interlayer source layer and the channel pillars.

According to an aspect of the present disclosure, there is provided a method of manufacturing a semiconductor device. The method may include sequentially stacking a lower source layer including a first dopant, a sacrificial layer, and an upper source layer including the first dopant. The method may include alternately stacking first material layers and second material layers on the upper source layer. The method may include forming channel pillars penetrating the first material layers, the second material layers, the upper source layer, and the sacrificial layer, the channel pillars extending to the inside of the lower source layer. The method may include forming, between the channel pillars, a slit penetrating the first material layers, the second material layers, and the upper source layer, the slit exposing the sacrificial layer therethrough. The method may include exposing the channel pillars by removing the sacrificial layer through the slit. The method may include forming an interlayer source layer inside a region from which the sacrificial layer is removed. The interlayer source layer may be in contact with the channel pillars, the lower source layer, and the upper source layer, and may include a second dopant. The method may include diffusing the second dopant from the interlayer source layer into a doped region of each channel pillar.

According to an aspect of the present disclosure, there is provided a method of manufacturing a semiconductor device. The method may include sequentially stacking a lower source layer, a sacrificial layer, and an upper source layer. The method may include alternately stacking first material layers and second material layers on the upper source layer. The method may include forming channel pillars penetrating the first material layers, the second material layers, the upper source layers, and the sacrificial layer, the channel pillars extending into the lower source layer. The method may include forming, between the channel pillars, a slit penetrating the first material layers, the second material layers, and the upper source layer, the slit exposing the sacrificial layer therethrough. The method may include exposing the channel pillars by removing the sacrificial layer through the slit. The method may include forming an inter-layer source layer inside a region in which the sacrificial layer is removed. The interlayer source layer may include a lower region being in contact with the channel pillars, the lower source layer, and the upper source layer. The lower region may include a first dopant, and an upper region may include a second dopant. The method may include diffusing the first and second dopants from the interlayer source layer into the channel pillars.

According to an aspect of the present disclosure, there is provided a method of manufacturing a semiconductor device. The method may include sequentially stacking a lower source layer, a sacrificial layer, and an upper source layer. The method may include alternately stacking first material layers and second material layers on the upper source layer. The method may include forming channel pillars penetrating the first material layers, the second material layers, the upper source layers, and the sacrificial layer. The channel pillars may extend into the lower source layer. The method may include doping a dopant in lower portions of the channel pillars, thereby forming a doped region at the lower portion of each of the channel pillars. The method may include forming, between the channel pillars, a slit penetrating the first material layers, the second material layers, and the upper source layer, the slit exposing the sacrificial layer therethrough. The method may include exposing the channel pillars by removing the sacrificial layer through the slit. The method may include forming an interlayer source layer being in contact with the channel pillars, the lower source layer, and the upper source layer inside a region from which the sacrificial layer is removed.

BRIEF DESCRIPTION OF THE DRAWINGS

FIGS. 2A to 2D are cross-sectional views illustrating various structures of a source-side channel region of a channel pillar according to embodiments of the present disclosure.

DETAILED DESCRIPTION

Figure 1:
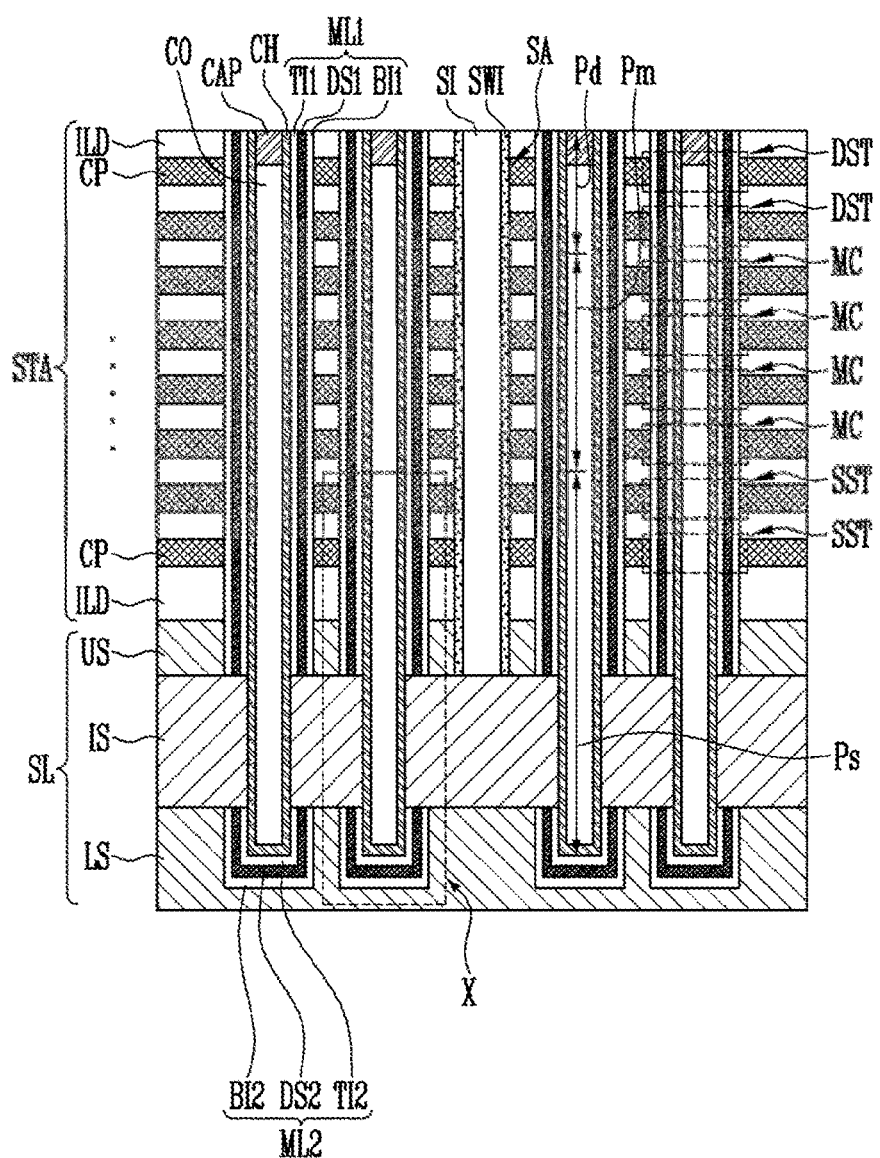
FIG. 1 is a cross-sectional view illustrating a semiconductor device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

Embodiments provide a semiconductor device having improved operational reliability and a manufacturing method thereof.

FIG. 1 is a cross-sectional view illustrating a semiconductor device according to an embodiment of the present disclosure.

Referring to FIG. 1, the semiconductor device according to an embodiment of the present disclosure may include a multi-layered source layer SL, a stack structure STA, channel pillars CH, slit insulating layers SI, and sidewall insulating layers SWI. Although not illustrated, driver transistors (not illustrated) constituting a circuit for driving a memory cell string of the semiconductor device may be disposed under the multi-layered source layer SL. In addition, some of the driver transistors and the multi-layered source layer SL may be electrically connected to each other through routing wires (not illustrated) or contact plugs (not illustrated) disposed between the driver transistors and the multi-layered source layer SL.

The multi-layered source layer SL may include a lower source layer LS, an interlayer source layer IS, and an upper source layer US, which are sequentially stacked. The lower source layer LS, the interlayer source layer IS, and the upper source layer US may be formed of various conductive materials.

The upper source layer US may be disposed over the lower source layer LS. The upper source layer US may be spaced apart from the lower source layer LS. The interlayer source layer IS may be disposed in between the lower source layer LS and the upper source layer US.

The lower source layer LS and the upper source layer US may be formed of a material capable of serving as a growth seed. The lower source layer LS and the upper source layer US may be formed of the same material as one another. For example, the lower source layer LS and the upper source layer US may include silicon. At least one of the lower source layer LS, the interlayer source layer IS, and the upper source layer US may include a dopant.

The interlayer source layer IS may be a material layer grown from the lower source layer LS and the upper source layer US. The interlayer source layer IS may include silicon. Alternatively, the interlayer source layer IS may be formed using a coating method such as a deposition process. A bottom surface of the interlayer source layer IS may be in contact with the lower source layer LS, and an upper surface of the source layer interlayer IS may be in contact with the upper source layer US.

The stack structure STA may be disposed on the multi-layered source layer SL. The stack structure STA may include interlayer insulating layers ILD and conductive patterns CP, which are alternately stacked. The conductive patterns CP may be used as gate electrodes of memory cells MC and gate electrodes of select transistors SST and DST. The interlayer insulating layers ILD may be used to insulate the conductive patterns CP from each other. The conductive patterns CP may include at least one of polysilicon, metal, and metal silicide. The interlayer insulating layers ILD may include oxide.

The stack structure STA may be penetrated by a slit SA. The slit SA may overlap the multi-layered source layer SL, and may be formed to penetrate the upper source layer US of the multi-layered source layer SL. A sidewall insulating layer SWI and a slit insulating layer SI may be formed inside the slit SA. The sidewall insulating layer SWI may be formed on a sidewall of the slit SA, and a vacant space of the slit SA on the sidewall insulating layer SWI may be filled with the slit insulating layer SI. The slit insulating layer SI may extend deeper into the stack structure STA/the multi-layered source layer SL than the sidewall insulating layer SWI. For example, the slit insulating layer SI formed in the slit SA may extend to an upper portion of the interlayer source layer IS. The sidewall insulating layer SWI may be formed to protect the interlayer insulating layers ILD, the conductive patterns CP, and the upper source layer US from an etching process, and may be formed of a different material from the interlayer insulating layers ILD, the conductive patterns CP, and the upper source layer US. The sidewall insulating layer SWI may be formed of a single layer or multiple layers. The sidewall insulating layer SWI may be formed of a nitride layer.

Each of the channel pillars CH penetrates the stack structure STA and the upper source layer US, and may extend into the lower source layer LS. Each of the channel pillars CH may be formed in a tube shape surrounding a core insulating layer CO. In this case, the height of the core insulating layer CO may be lower than the channel pillars CH. A capping layer CAP may be further formed over the core insulating layer CO. The capping layer CAP may be surrounded by an upper end of any one of channel pillars CH. The channel pillars CH and the capping layer CAP may be formed of a semiconductor material. Although not illustrated, the capping layer CAP and the core insulating layer CO may not be formed. In this case, each of the channel pillars CH may be formed such that a hole in which the channel pillar CH is disposed is filled with the semiconductor material of which the channel pillars CH is formed. Each of the channel pillars CH may be used as a channel region of a memory cell string. The slit SA may be disposed between adjacent channel pillars CH.

The conductive patterns CP may include at least one source select line, word lines, and at least one drain select line. The source select line may correspond to one or more conductive pattern layers disposed under the word lines. The drain select line may correspond to one or more conductive pattern layers disposed over the word lines.

Memory cells MC may be formed at intersection portions of the channel pillars CH and the word lines. Source select transistors SST may be formed at intersection portions of the channel pillars CH and the source select line. Drain select transistors DST may be formed at intersection portions of the channel pillars CH and the drain select line. A source select transistor SST, memory cells MC, and a drain select transistor DST coupled in series to each other may form a memory cell string.

The source select line may be connected to a gate of the source select transistor SST. Each of the word lines may be connected to a gate of a memory cell MC corresponding thereto. The drain select line may be connected to a gate of the drain select transistor DST. The source select transistor SST may be stacked in a single-level structure or a multi-level structure over the multi-layered source layer SL. The memory cells MC may be stacked over the source select transistor SST. The drain select transistor DST may be stacked in a single-level structure or a multi-level structure over the memory cells MC.

Each of the channel pillars CH may include a source-side channel region Ps overlapping the source select transistor SST, a memory cell channel region Pm disposed over the source-side channel region Ps, the memory cell channel region Pm overlapping the memory cells MC, and a drain-side channel region Pd disposed over the memory cell channel region Pm, the drain-side channel region Pd overlapping the drain select transistor DST.

The source-side channel region Ps may have a higher threshold voltage than the memory cell channel region Pm. To this end, a dopant may be inserted into the source-side channel region Ps. Doped regions inside the source-side channel region may be formed into various structures, which will be described in detail later with reference to FIGS. 2A to 2D.

The source-side channel region Ps may be in contact with the interlayer source layer IS. The source-side channel region Ps may extend through the upper source layer US into the interlayer source layer IS. For example, the source-side channel region Ps may pass through the upper source layer US and the interlayer source layer IS. The source-side channel region Ps may extend in an upper direction to overlap with at least one-layer conductive pattern from the lowermost layer among the conductive patterns CP. The lower conductive pattern overlapping the source-side channel region Ps may be a source select line. The source-side channel region Ps may extend into the lower source layer LS.

A first multi-layered pattern ML1 may be disposed between each of the channel pillars CH and the stack structure STA. The first multi-layered pattern ML1 may surround an outer wall of each channel pillar CH, and may extend along a sidewall of the upper source layer US. The first multi-layered pattern ML1 may include a first tunnel insulating pattern TI1, a first data storage pattern DS1 surrounding the first tunnel insulating pattern TI1, and a first blocking insulating pattern BI1 surrounding the first data storage pattern DS1.

A second multi-layered pattern ML2 may be disposed between each of the channel pillars CH and the lower source layer LS. The second multi-layered pattern ML2 may include a second tunnel insulating pattern TI2 surrounding an outer wall of each channel pillar CH, a second data storage pattern DS2 surrounding the second tunnel insulating pattern TI2, and a second blocking insulating pattern BI2 surrounding the second data storage pattern DS2.

The first multi-layered pattern ML1 and the second multi-layered pattern ML2 may be separated by the interlayer source layer IS. The first tunnel insulating pattern TI1 and the second tunnel insulating pattern TI2 may be portions of a tunnel insulating layer separated by the interlayer source layer IS. The first data storage pattern DS1 and the second data storage pattern DS2 may be portions of a data storage layer separated by the interlayer source layer IS. The first blocking insulating pattern BI1 and the second blocking insulating pattern BI2 may be portions of a blocking insulating layer separated by the interlayer source layer IS. The data storage layer may include silicon, nitride, a phase changeable material, nanodots, etc. The tunnel insulating layer may include a silicon oxide layer through which electrical charges can "tunnel." The blocking insulating layer may include an oxide layer that can block electrical charges.

Portions of the first multi-layered pattern ML1 overlapping the source-side channel region Ps and the drain-side channel region Pd may be used as gate insulating layers of the source select transistor SST and the drain select transistor DST.

In an embodiment of the present disclosure, there is formed a doped region structure having a higher threshold voltage at the source-side channel region Ps than at the memory cell channel region Pm.

FIGS. 2A to 2D are cross-sectional views illustrating various structures of the source-side channel region of the channel pillar according to embodiments of the present disclosure. Particularly, FIGS. 2A to 2D are enlarged cross-sectional views illustrating region X illustrated in FIG. 1.

Referring to FIGS. 2A to 2D, the source-side channel region Ps may penetrate the conductive patterns CP used as the source select lines and the interlayer insulating layers ILD under the conductive patterns CP, and may extend into the multi-layered source layer SL. The source-side channel region Ps and the upper source layer US may be spaced apart from each other with the first multi-layered pattern ML1 interposed therebetween. The first multi-layered pattern ML1 may extend along sidewalls of the interlayer insulating layers ILD and the conductive patterns CP. A lower end of the source-side channel region Ps and the lower source layer LS may be spaced apart from each other with the second multi-layered pattern ML2 interposed therebetween. The source-side channel region Ps may be in contact with the interlayer source layer IS.

Figure 2A:
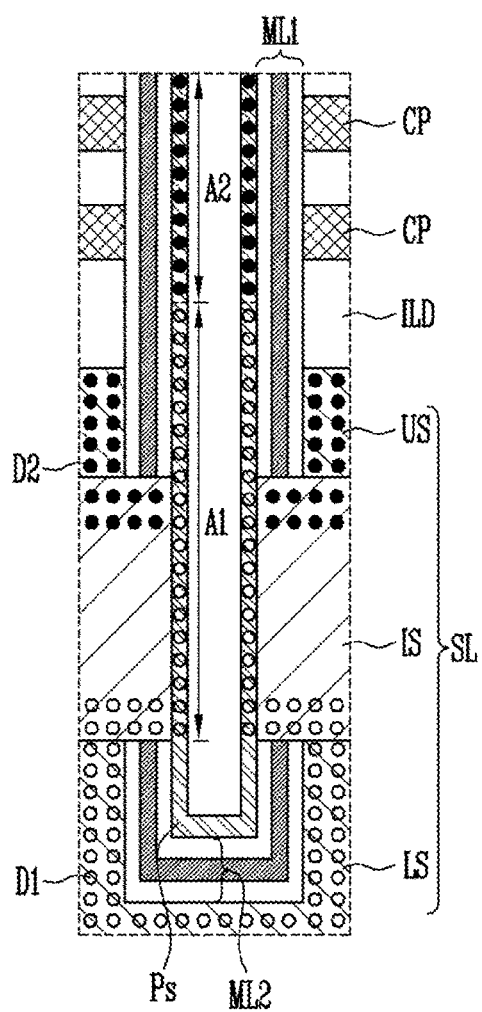

Referring to FIG. 2A, the source side channel region Ps may include a first doped region A1 including a first dopant D1 and a second doped region A2 including a second dopant D2. The first doped region A1 may overlap the interlayer source layer IS, and may extend into the source-side channel region Ps at a higher height than the upper source layer US. The second doped region A2 is disposed over the first doped region A1, and may extend to overlap the conductive patterns CP connected to the source select transistors. For example, the second doped region A2 may overlap at least one layer from the lowermost layer among the conductive patterns CP.

The lower source layer LS may include the first dopant D1. More specifically, the lower source layer LS may be a doped silicon layer including the first dopant D1.

The upper source layer US may include the second dopant D2. More specifically, the upper source layer US may be a doped silicon layer including the second dopant D2.

The interlayer source layer IS may include a lower region including the first dopant D1 and an upper region including the second dopant D2. The interlayer source layer IS may be a doped silicon layer including the first and second dopants D1 and D2.

The first dopant D1 inside the interlayer source layer IS and source-side channel region Ps may be one diffused from the lower source layer LS. The second dopant D2 inside the interlayer source layer IS and the source-side channel region Ps may be one diffused from the upper source layer US.

The second doped region A2 of the source-side channel region Ps has a higher threshold voltage than the memory cell channel region (Pm of FIG. 1) disposed over the second doped region A2. In order to increase the threshold voltage of the second doped region A2, the second dopant D2 diffused into the second doped region A2 may be of a P type. The P-type dopant may include boron (B). The memory cell channel region (Pm of FIG. 1) may include an undoped layer or N-type doped layer therein.

The first dopant D1 is of a different type from the second dopant D2. More specifically, the first dopant D1 is of an N type. The N-type dopant may include phosphorus (P). A PN diode structure may be formed inside the source-side channel region Ps through the first doped region A1 including the N-type first dopant D1 and the second doped region A2 including the P-type second dopant D2 therein.

The PN diode structure may be formed inside the multi-layered source layer SL such that the lower source layer LS including the N-type first dopant D1, the interlayer source layer IS including the N-type first dopant D1 and the P-type second dopant D2, and the upper source layer US including the P-type second dopant D2 are stacked on top of one another.

Figure 2B:
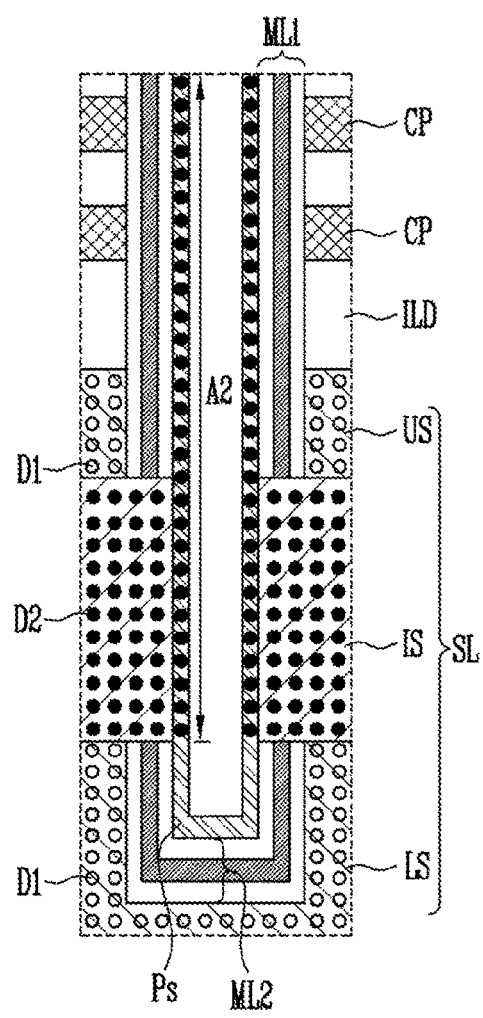

Referring to FIG. 2B, the source-side channel region Ps may include a second doped region A2 including a second dopant D2. The second doped region A2 may overlap the interlayer source layer IS, and may extend to overlap the conductive patterns CP connected to the source select transistors. For example, the second doped region A2 may overlap at least one layer from the lowermost layer among the conductive patterns CP.

The lower source layer LS and the upper source layer US may include a first dopant D1. More specifically, the lower source layer LS and the upper source layer US may be doped silicon layers including the first dopant D1 therein.

The interlayer source layer IS may include the second dopant D2. More specifically, the interlayer source layer IS may be a doped silicon layer including the second dopant D2 therein.

The second dopant D2 inside the source-side channel region Ps may be one diffused from the interlayer source layer IS.

The second dopant D2 diffused into the second doped region A2 may be of a P-type. Accordingly, the memory cell channel region (Pm of FIG. 1) disposed over the second doped region A2 of the source-side channel region Ps may have a lower threshold voltage than the second doped region A2. The P-type dopant may include boron (B). The memory cell channel region (Pm of FIG. 1) may include an undoped layer or an N-type doped layer therein.

The first dopant D1 is of a different type from the second dopant D2. More specifically, the first dopant D1 may be of an N-type. The N-type dopant may include phosphorus (P). The second doped region A2 and the interlayer source layer IS, which include the P-type second dopant D2, and the upper source layer US and the lower source layer LS, which include the N-type first dopant D1, may form a PN diode structure.

Referring to FIG. 2C, the source-side channel region Ps may include a first doped region A1 and a second doped region A2, which have the same structure as illustrated in FIG. 2A.

The interlayer source layer IS may include a lower region including a first dopant D1 and an upper region including a second dopant D2. Therefore, the interlayer source layer IS may form a PN diode structure. The interlayer source layer IS may be a doped silicon layer including the first and second dopants D1 and D2.

The first dopant D1 inside the source-side channel region Ps may be one diffused from the lower region of the interlayer source layer IS. The second dopant D2 inside the source-side channel region Ps may be one diffused from the upper region of the interlayer source layer IS.

The second doped region A2 of the source-side channel region Ps may have a higher threshold voltage than the memory cell channel region (Pm of FIG. 1) disposed over the second doped region A2. In order to increase the threshold voltage of the second doped region A2, the second dopant D2 diffused into the second doped region A2 may be of a P-type. The P-type dopant may include boron (B). The memory cell channel region (Pm of FIG. 1) may include an undoped layer or an N-type doped layer therein.

The first dopant D1 is of a different type from the second dopant D2. More specifically, the first dopant D1 may be of an N-type. The N-type dopant may include phosphorus (P). In the source-side channel region Ps, the first doped region A1 including the N-type first dopant D1 and the second doped region A2 including the P-type second dopant D2 may form a PN diode structure.

Referring to FIG. 2D, the source-side channel region Ps may be a doped region including a second dopant D2. That is, the second dopant D2 may be introduced across the entire source-side channel region Ps. Therefore, the doped region of the source-side channel region Ps may overlap the interlayer source layer IS, overlap the conductive patterns CP connected to the source select transistors, and overlap the upper source layer US and the lower source layer LS. The doped region of the source-side channel region Ps may overlap at least one layer from the lowermost layer among the conductive patterns CP.

At least one of the lower source layer LS, the interlayer source layer IS, and the upper source layer US may include a first dopant. More specifically, at least one of the lower source layer LS, the interlayer source layer IS, and the upper source layer US may be a doped silicon layer including the first dopant.

The second dopant D2 may be introduced into the source-side channel region Ps. The second dopant D2 may be of a P-type. Accordingly, the memory cell channel region (Pm of FIG. 1) disposed over the source-side channel region Ps may have a lower threshold voltage than the source-side channel region Ps. The P-type dopant may include boron (B). The memory cell channel region (Pm of FIG. 1) may include an undoped layer or an N-type doped layer.

The first dopant included in at least one of the lower source layer LS, the interlayer source layer IS, and the upper source layer US may be of a different type from the second dopant D2. More specifically, the first dopant may be of an N-type. The N-type dopant may include phosphorus (P). At least one of the source-side channel region Ps including the P-type second dopant D2 and at least one of the lower source layer LS, the interlayer source layer IS, and the upper source layer US, which include the N-type first dopant, may form a PN diode structure.

As described above, some embodiments of the present disclosure may include doped regions having various structures such that the source-side channel region Ps can have a higher threshold voltage than the memory cell channel region (Pm of FIG. 1). Accordingly, in some embodiments of the present disclosure, it is possible to reduce off-current leakage of the source select transistor and to improve erase characteristics.

FIGS. 3A to 3F are cross-sectional views illustrating a manufacturing method of a semiconductor device illustrated in FIG. 2A.

Figure 3A:
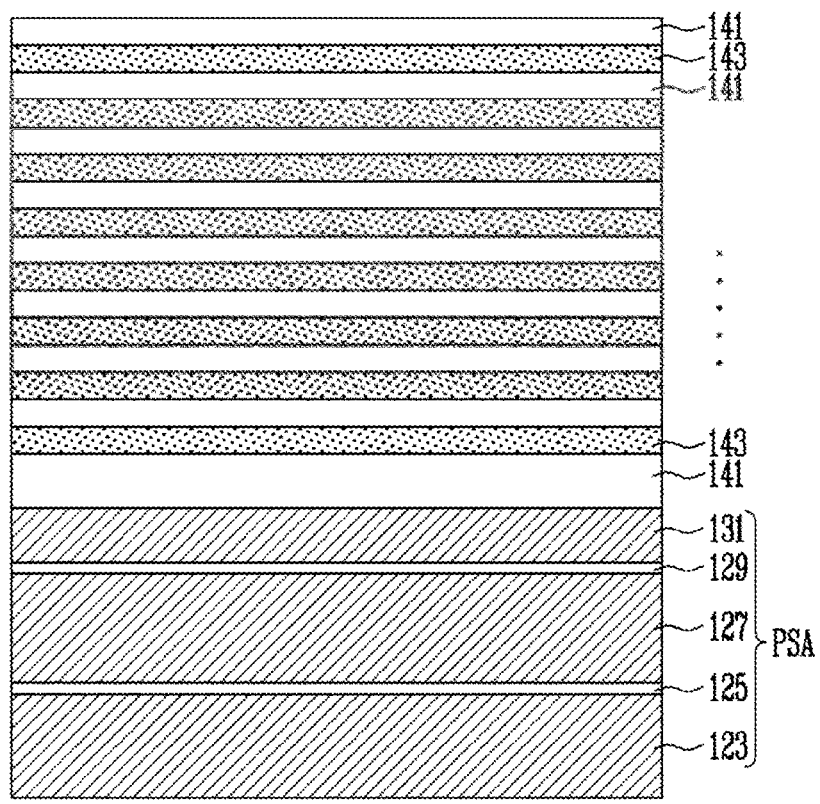
FIGS. 3A to 3F are cross-sectional views illustrating a manufacturing method of a semiconductor device illustrated in FIG. 2A.

Referring to FIG. 3A, a preliminary source stack structure PSA may be formed on a substrate (not illustrated) including a lower structure. Although not illustrated, the lower structure may include driver transistors constituting a circuit for driving memory cell strings of the semiconductor device, routing wires, and contact plugs, which are electrically connected to the drive transistors. The preliminary source stack structure PSA may be formed by sequentially stacking a lower source layer 123, a sacrificial layer 127, and an upper source layer 131.

The lower source layer 123 may include a first dopant. For example, the lower source layer 123 may be used as a seed layer for an epitaxial growth of an interlayer source layer in a subsequent process. The lower source layer 123 may be a doped silicon layer including the first dopant.

The upper source layer 131 may include a second dopant. For example, the upper source layer 131 may be used as a seed layer for an epitaxial growth of the interlayer source layer in a subsequent process. The upper source layer 131 may be a doped silicon layer including the second dopant.

The first dopant and the second dopant are different from each other. More specifically, the first dopant may be of an N type and the second dopant may be of a P type.

The sacrificial layer 127 may be formed of a material selectively removable in a subsequent process. More specifically, the sacrificial layer 127 may be formed of a material having a different etching selection ratio from the lower source layer 123 and the upper source layer 131. The sacrificial layer 127 may be formed of an undoped polysilicon layer.

The preliminary source stack structure PSA may further include first and second protective layers 125 and 129. The first protective layer 125 may be deposited before the sacrificial layer 127 is formed, and the second protective layer 129 may be deposited after the sacrificial layer 127 is formed, so that the sacrificial layer 127 can be interposed between the first and second protective layers 125 and 129. The first protective layer 125 may be disposed between the sacrificial layer 127 and the lower source layer 123, and the second protective layer 129 may be disposed between the sacrificial layer 127 and the upper source layer 131. The first and second protective layers 125 and 129 may be formed of a material having a different etching selection ratio from the lower source layer 123, the sacrificial layer 127, and the upper source layer 131. For example, the first and second protective layers 125 and 129 may be formed of an oxide layer.

First material layers 141 and second material layers 143 may be alternately stacked on the preliminary source stack structure PSA.

The second material layers 143 may be formed of a different material from the first material layers 141. For example, the first material layers 141 may be formed of an insulating material for interlayer insulating layers, and the second material layers 143 may be formed of a conductive material for conductive patterns.

Alternatively, the first material layers 141 may be formed of an insulating material for interlayer insulating layers. The second material layers 143 may be used as sacrificial layers, and may be formed of a sacrificial insulating material having a different etching selection ratio from the first material layers 141. In this case, the first material layers 141 may be formed of a silicon oxide layer, and the second material layers 143 may be formed of a silicon nitride layer. When both the first and second material layers 141 and 143 are formed of an insulative material, it is possible to reduce the degree of difficulty of etching processes for forming channel holes or slits.

Alternatively, the first material layers 141 may be used as sacrificial layers, and may be formed of a sacrificial conductive material having a different etching selection ratio from the second material layers 143. The second material layers 143 may be formed of a conductive material for conductive patterns. In this case, the first material layers 141 may be formed of an undoped polysilicon layer, and the second material layers 143 may be formed of a doped polysilicon layer. When both the first and second material layers 141 and 143 are formed of a silicon-based material, it is possible to reduce the degree of difficulty of etching processes for forming channel holes or slits.

Figure 3B:
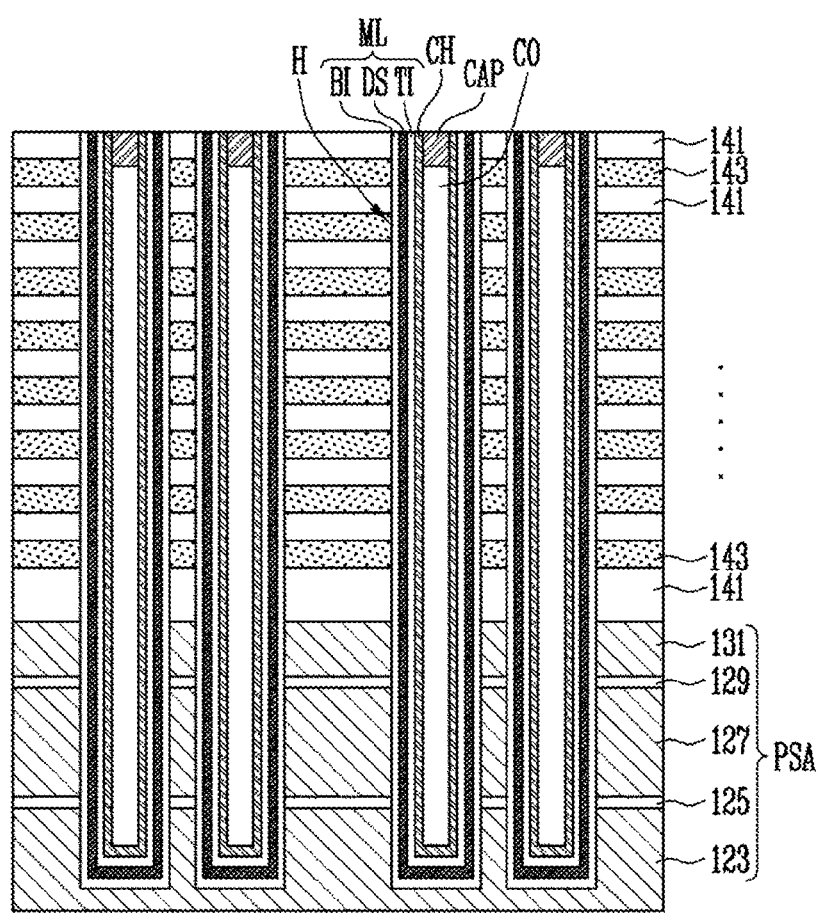

Referring to FIG. 3B, there are formed channel holes H penetrating the first and second material layers 141 and 143 and the preliminary source stack structure PSA. The channel holes H may extend to completely penetrate the upper source layer 131, the second protective layer 129, the sacrificial layer 127, and the first protective layer 125 of the preliminary source stack structure PSA. The channel holes H may extend into the lower source layer 123 of the preliminary source stack structure PSA.

Subsequently, channel pillars CH surrounded by multi-layered layers ML may be formed inside the channel holes H, respectively. The multi-layered layer ML may be formed by sequentially stacking a blocking insulating layer BI, a data storage layer DS, and a tunnel insulating layer TI. The blocking insulating layer BI, the data storage layer DS, and the tunnel insulating layer TI may be formed on a surface of each channel hole H. Each of the channel pillars CH may be formed on the tunnel insulating layer TI. The channel pillar CH may be formed to completely fill each of the channel hole H. Alternatively, the channel pillar CH may be formed to open a central region of each of the channel holes H. When the central region of each of the channel holes H is open as a result of the formation of the channel pillar CH, a core insulating layer CO may fill the central region of each of the channel holes H. The core insulating layer CO may be formed lower than each of the channel holes H. In this case, a capping layer CAP is further formed on the core insulating layer CO to fill an upper end of each of the channel holes H.

Figure 3C:
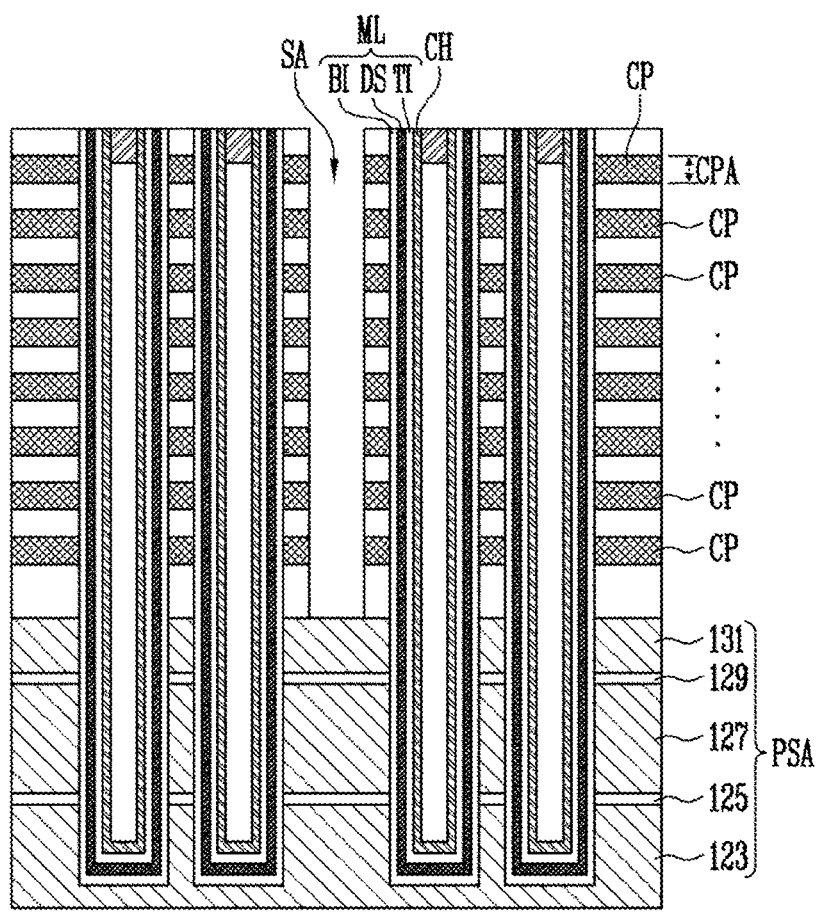

Referring to FIG. 3C, the first and second material layers 141 and 143 disposed between the channel pillars CH may be etched to form a slit SA penetrating them.

When the first material layers 141 are formed of an insulating material for interlayer insulating layers and the second material layers 143 are formed of a sacrificial insulating material, the second material layers 143 may be selectively removed through the slit SA to form an open portion at conductive pattern regions CPA. At this time, the channel pillars CH are supported by the preliminary source stack structure PSA, and thus the structure of the channel pillars CH can be stably maintained.

Subsequently, each of the conductive pattern regions CPA may be filled with a material of conductive patterns CP provided through the slit SA. That is, the material of the conductive patterns CP may be provided through the slit SA, and the second material layers 143 may be replaced with the conductive patterns CP. The conductive patterns CP may include tungsten, etc. Although not illustrated, before the conductive patterns CP are formed, at least one of a barrier layer and a blocking insulating layer may be further formed along the surface of each of the conductive patter regions CPA.

Unlike FIG. 3C, when the first material layers (141 of FIG. 3B) are formed of an insulating material for interlayer insulating layers and the second material layers (143 of FIG. 3B) are formed of a conductive material for conductive patterns, the second material layers (143 of FIG. 3B) may be separated into the conductive patterns CP through the slit SA.

Alternatively, when the first material layers (141 of FIG. 3B) are formed of a sacrificial conductive material and the second material layers (143 of FIG. 3B) are formed of a conductive material for conductive patterns, the first material layers (141 of FIG. 3B) may be respectively replaced with a material of the interlayer insulating layer provided through the slit SA, and the second material layers (143 of FIG. 3B) may be separated into the conductive patterns CP by the slit SA.

Figure 3D:
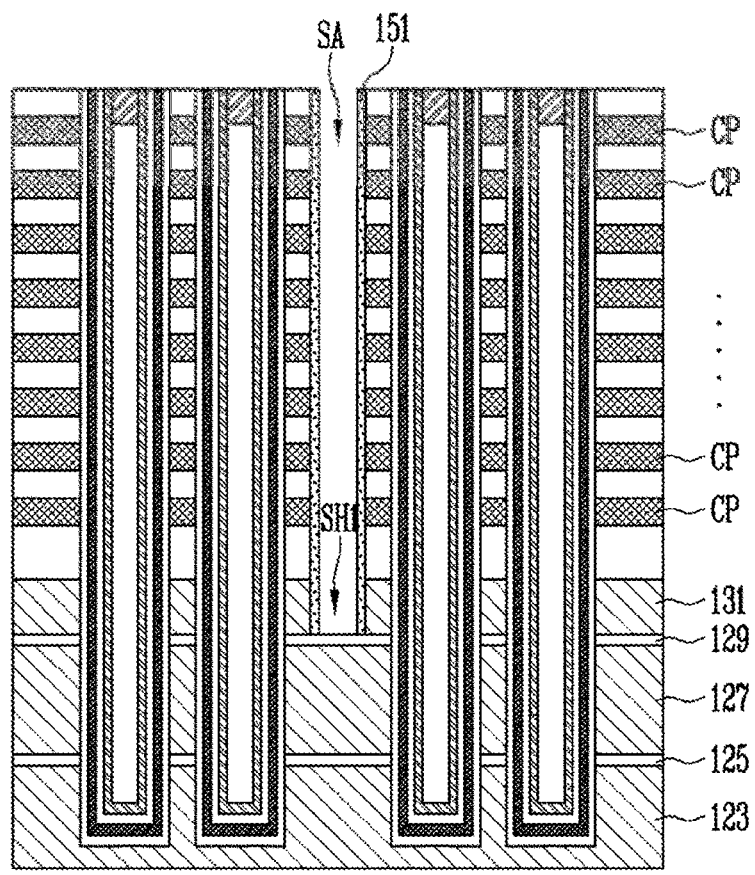

Referring to FIG. 3D, the upper source layer 131 exposed through the slit SA may be etched, thereby forming a lower slit SH1 penetrating the upper source layer 131. In this case, the second protective layer 129 may be used as an etch stop layer using a difference in the etching selection ratio between the upper source layer 131 and the second protective layer 129.

After that, a sidewall insulating layer 151 having a different etching selection ratio from the sacrificial layer 127 may be formed on sidewalls of the slit SA and the lower slit SH1. For example, the sidewall insulating layer 151 may be formed of a nitride layer. The sidewall insulating layer 151 can protect the conductive patterns CP and the upper source layer 131 while a subsequent process of removing the sacrificial layer 127 is being performed.

Figure 3E:
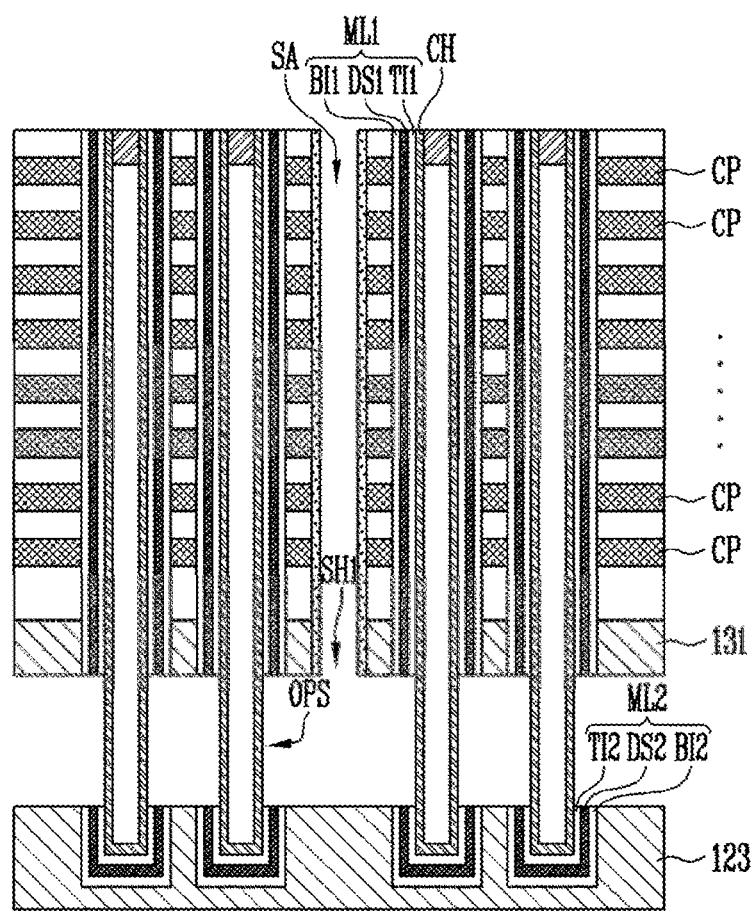

Referring to FIG. 3E, a portion of the second protective layer (129 of FIG. 3D) is etched through the lower slit SH1, thereby exposing the sacrificial layer (127 of FIG. 3D). Subsequently, the exposed sacrificial layer is removed. While the sacrificial layer (127 of FIG. 3D) is being removed, the first and second protective layers (125 and 129 of FIG. 3D) may be used as etch stop layers using a difference in the etching selection ratio between the sacrificial layer (127 of FIG. 3D) and the first and second protective layers (125 and 129 of FIG. 3D). Accordingly, it is possible to prevent loss of the lower source layer 123 and the upper source layer 131 while the sacrificial layer (127 of FIG. 3D) is being removed.

A portion of the multi-layered layer (ML of FIG. 3D) may be exposed through the region from which the sacrificial layer (127 of FIG. 3D) is removed.

Subsequently, the exposed portion of the multi-layered layer (ML of FIG. 3D) may be removed through the slit SA and the lower slit SH1, thereby separating the multi-layered layer into a first multi-layered pattern ML1 and a second multi-layered pattern ML2. The first and second protective layers (125 and 129 of FIG. 3D) may be removed while the exposed portion of the multi-layered layer is being removed. Therefore, a source region (OPS) through which a partial region of each channel pillar CH is exposed may be formed between the lower source layer 123 and the upper source layer 131.

The source region OPS may separate the blocking insulating layer (BI of FIG. 3D) into first and second blocking insulating patterns BI1 and BI2, separate the data storage layer (DS of FIG. 3D) into first and second data storage patterns DS1 and DS2, and separate the tunnel insulating layer (TI of FIG. 3D) into first and second tunnel insulating patterns TI1 and TI2.

Figure 3F:
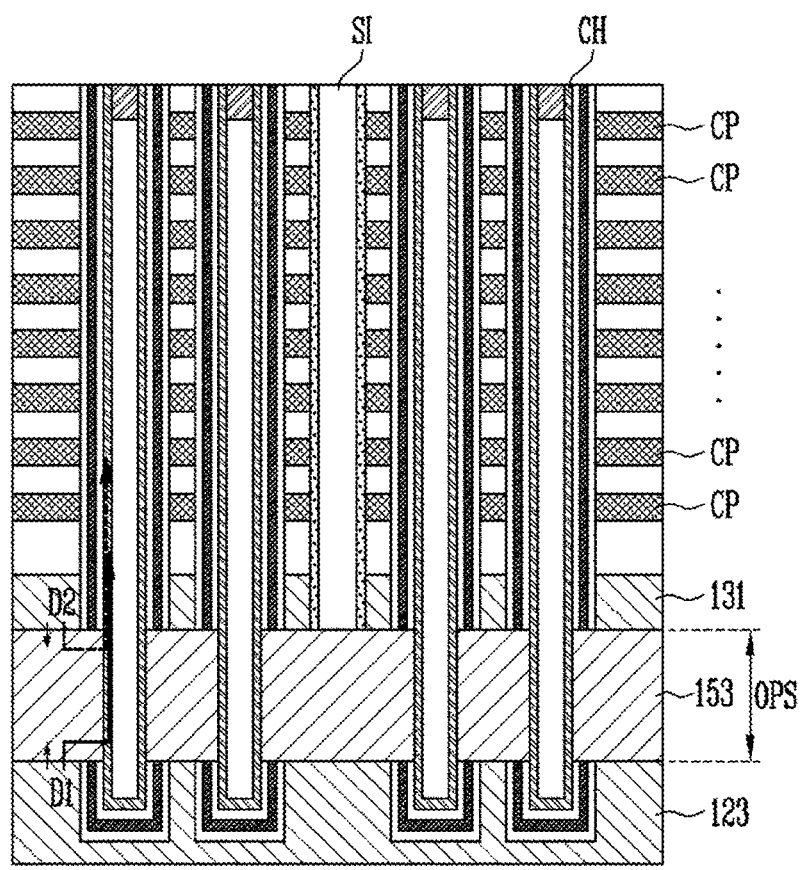

Referring to FIG. 3F, an interlayer source layer 153 may be formed in the source region OPS. After that, a first dopant D1 from the lower source layer 123 and a second dopant D2 from the upper source layer 131 may be diffused into the interlayer source layer 153 and the channel pillars CH.

The interlayer source layer 153 may be grown from the lower source layer 123, the upper source layer 131, and the channel pillars CH through a selective epitaxial growth process. Alternatively, the interlayer source layer 153 may be formed through a coating process such as a deposition process. The interlayer source layer 153 may be formed to come in contact with the lower source layer 123, the upper source layer 131, and the channel pillars CH.

The first dopant D1 and the second dopant D2 may be diffused into the interlayer source layer 153 and the channel pillars CH through a thermal process. The first dopant D1 may be of an N type and the second dopant D2 may be of a P type to form the structure illustrated in FIG. 2A. The first dopant D1 may be diffused into a first doped region of each channel pillar CH, which overlaps the interlayer source layer 153, and the second dopant D2 may be diffused into a second doped region of each channel pillar CH, which is disposed over the first doped region. The second doped region, as illustrated in FIG. 2A, may extend to overlap the lowermost conductive pattern among the conductive patterns CP or to further overlap at least one conductive pattern layer stacked over the lowermost conductive pattern.

The slit and the lower slit (SA and SH1 of FIG. 3E) may be filled with a slit insulating layer SI.

Figure 4:
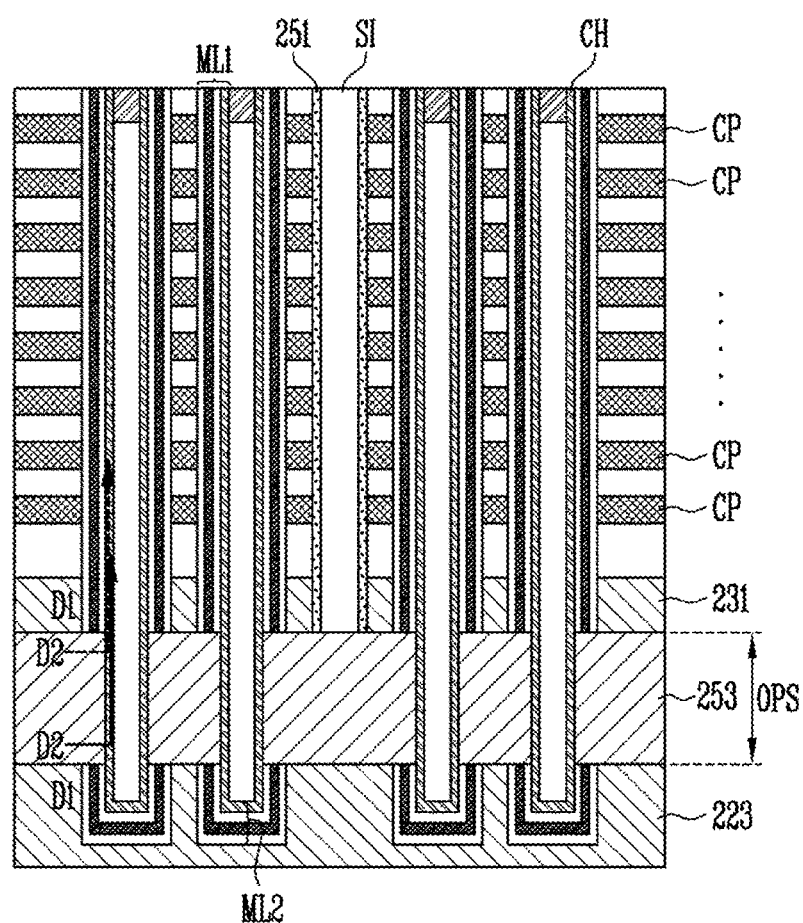
FIG. 4 is a cross-sectional view illustrating a manufacturing method of a semiconductor device illustrated in FIG. 2B.

FIG. 4 is a cross-sectional view illustrating a manufacturing method of a semiconductor device illustrated in FIG. 2B.

Before a process illustrated in FIG. 4 is performed, the following processes may be performed.

First, there may be formed a preliminary source stack structure in which a lower source layer 223, a sacrificial layer (not illustrated), and an upper source layer 231 are stacked as illustrated in FIG. 3A. However, in an embodiment of the present disclosure, the lower source layer 223 and the upper source layer 231 may include a first dopant D1. The first dopant D1 may be of an N type. More specifically, the lower source layer 223 and the upper source layer 231 may be N-type doped silicon layers.

After that, first material layers (not illustrated) and second material layers (not illustrated) may be alternately stacked on the preliminary source stack structure as illustrated in FIG. 3A.

Subsequently, processes identical to those described with reference to FIGS. 3B to 3E may be performed, thereby forming channel pillars CH, a first multi-layered pattern ML1, a second multi-layered pattern ML2, conductive patterns CP, and a sidewall insulating layer 251.

After that, a source region OPS between the lower source layer 223 and the upper source layer 231 may be filled with an interlayer source layer 253. The interlayer source layer 253 may include a second dopant D2. The second dopant D2 may be of a P type. More specifically, the interlayer source layer 253 may be formed by depositing a P-type doped silicon layer. The interlayer source layer 253 may be formed to come in contact with the lower source layer 223, the upper source layer 231, and the channel pillars CH.

Subsequently, as illustrated in FIG. 4, the second dopant D2 from the interlayer source layer 253 is diffused into a doped region arranged in each channel pillar CH. The second dopant D2 may be diffused into the channel pillars CH through a thermal process. The second dopant D2 may be diffused up to a height at which the lowermost conductive pattern among the conductive patterns CP is disposed, or may be diffused up to a height higher than the lowermost conductive pattern, so that the structure illustrated in FIG. 2B can be formed. Accordingly, the doped region including the second dopant D2 can overlap at least one layer from the lowermost layer among the conductive patterns CP. Also, the doped region including the second dopant D2 can overlap the interlayer source layer 253. The diffusion distance of the second dopant D2 may be controlled such that the doped region can be disposed under memory cell channel regions of the channel pillars CH, which have a relatively low threshold voltage.

After that, a slit insulating layer SI may be formed in a slit.

Figure 5:
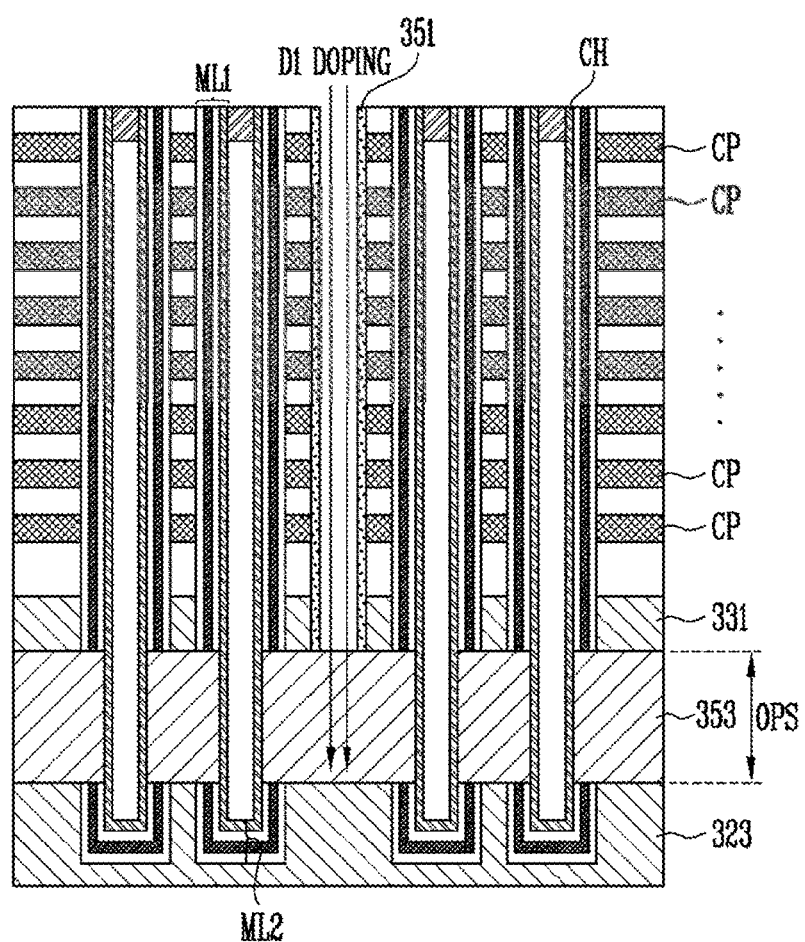
FIG. 5 is a cross-sectional view illustrating a manufacturing method of a semiconductor device illustrated in FIG. 2C.

FIG. 5 is a cross-sectional view illustrating a manufacturing method of a semiconductor device illustrated in FIG. 2C.

Before a process illustrated in FIG. 5 is performed, the following processes may be performed.

First, there may be formed a preliminary source stack structure in which a lower source layer 323, a sacrificial layer (not illustrated), and an upper source layer 331 are stacked as illustrated in FIG. 3A.

After that, first material layers (not illustrated) and second material layers (not illustrated) may be alternately stacked on the preliminary source stack structure as illustrated in FIG. 3A.

Subsequently, processes identical to those described with reference to FIGS. 3B to 3E may be performed, thereby forming channel pillars CH, a first multi-layered pattern ML1, a second multi-layered pattern ML2, conductive patterns CP, and a sidewall insulating layer 251.

After that, a source region OPS between the lower source layer 323 and the upper source layer 331 may be filled with a conductive layer doped with a second dopant. For example, the source region OPS may be filled with a P-type doped silicon layer by depositing the P-type doped silicon layer.

Subsequently, as illustrated in FIG. 5, the source region OPS may be filled with the conductive layer, and a lower region of the conductive layer including the second dopant may be doped as a target with a first dopant D1. Accordingly, there is formed an interlayer source layer 353 divided into a lower region including the first dopant D1 and an upper region including the second dopant. The first dopant D1 may be of an N type and the second dopant may be of a P type.

After that, the first dopant D1 and the second dopant D2 from the interlayer source layer 353 are diffused into the channel pillars CH such that first and second doped regions having the structure illustrated in FIG. 2C can be formed. More specifically, the first dopant D1 may be diffused into the first doped region overlapping the interlayer source layer 353, and the second dopant may be diffused into the second doped region disposed over the first doped region. The first dopant D1 and the second dopant may be diffused into the channel pillars CH through a thermal process.

Subsequently, subsequent processes such as a process of forming a slit insulating layer may be performed.

Figure 6:
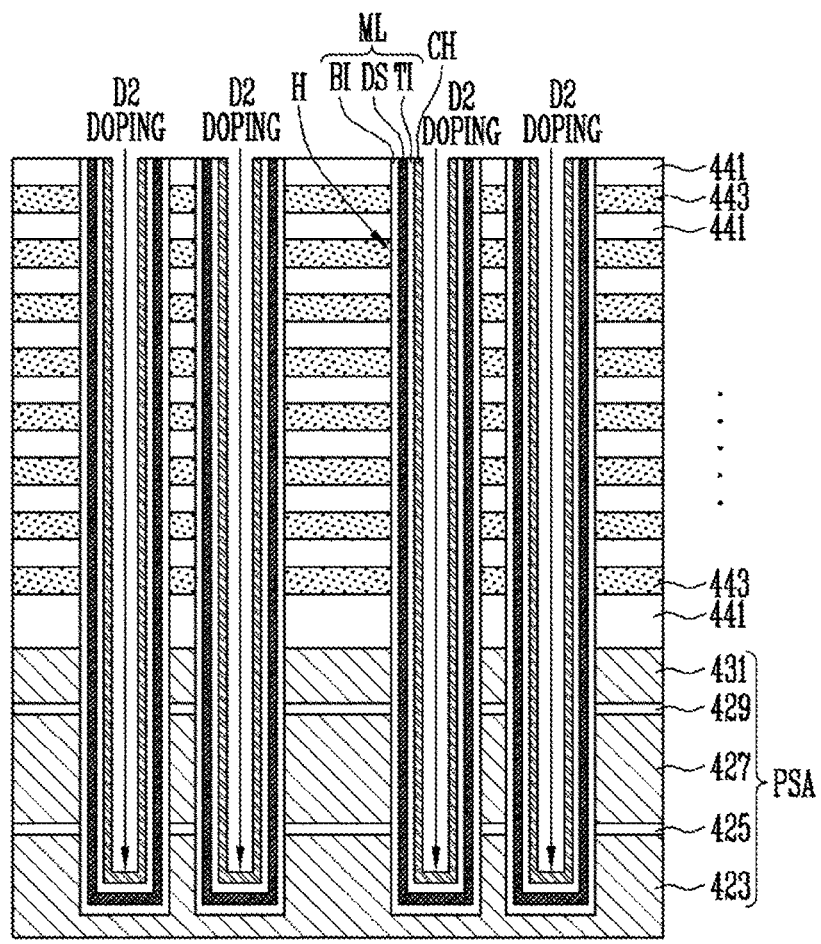
FIG. 6 is a cross-sectional view illustrating a manufacturing method of a semiconductor device illustrated in FIG. 2D.

FIG. 6 is a cross-sectional view illustrating a manufacturing method of a semiconductor device illustrated in FIG. 2D.

Before a process illustrated in FIG. 6 is performed, the following processes may be performed.

First, there may be formed a preliminary source stack structure PSA in which a lower source layer 423, a first protective layer 425, a sacrificial layer 427, a second protective layer 429, and an upper source layer 431 are stacked as illustrated in FIG. 3A. At least one of the lower source layer 423 and the upper source layer 431 may include a first dopant. The first dopant may be of an N type.

After that, first material layers 441 and second material layers 443 may be alternately stacked on the preliminary source stack structure PSA as illustrated in FIG. 3A.

Subsequently, there are formed channel holes H completely penetrating the upper source layer 431, the second protective layer 429, the sacrificial layer 427, and the first protective layer 425. Here, the channel holes H may extend into the lower source layer 423.

After that, a multi-layered layer ML in which a blocking insulating layer BI, a data storage layer DS and a tunnel insulating layer DS are sequentially stacked may be formed inside each of the channel holes H. Subsequently, channel pillars CH may be formed inside the channel holes H, respectively. Each of the channel pillars CH may be formed on the multi-layered layer ML. The channel pillar CH may be formed to completely fill each of the channel holes H, or may be formed to open a central region of each of the channel holes H.

Subsequently, a second dopant D2 may be inserted into a lower portion of each of the channel pillars CH, thereby forming a doped region at the lower portion of each of the channel pillars CH. The second dopant D2 may be diffused through a thermal process such that the doped region can overlap the preliminary source stack structure PSA and at least one layer among the second material layers 443. The doped region corresponds to the source-side channel region illustrated in FIG. 2D. The doped region is disposed under a memory cell channel region of each of the channel pillars CH, which has a relatively low threshold voltage. The second dopant D2 may be of a P type.

After that, subsequent processes such as a process of forming a core insulating layer and a process of forming a capping layer, described in FIG. 3B, may be further performed. Subsequently, there are sequentially performed a process of forming a slit, a process of forming conductive patterns, and a process of opening a source region to separate the multi-layered pattern ML into first and second multi-layered patterns, illustrated in FIGS. 3C and 3E. Then, the source region is filled with an interlayer source layer. The interlayer source layer may include the first dopant.

As described above, in some embodiments of the present disclosure, it is possible to increase the threshold voltage of the source-side channel region by inserting a dopant into the source-side channel region of each of the channel pillars CH using various methods.

In the embodiments of the present disclosure, the doped region may be formed at a lower portion of the channel pillar, adjacent to the multi-layered source layer, so that the threshold voltage of the source-side channel region can be increased as compared to that of the memory cell channel region. Accordingly, it is possible to reduce off-current leakage of the source select transistor and to improve erase characteristics of the semiconductor device.

In some embodiments of the present disclosure, it is possible to improve the operational reliability of the semiconductor device by using a stably operating source select transistor.

Figure 7:
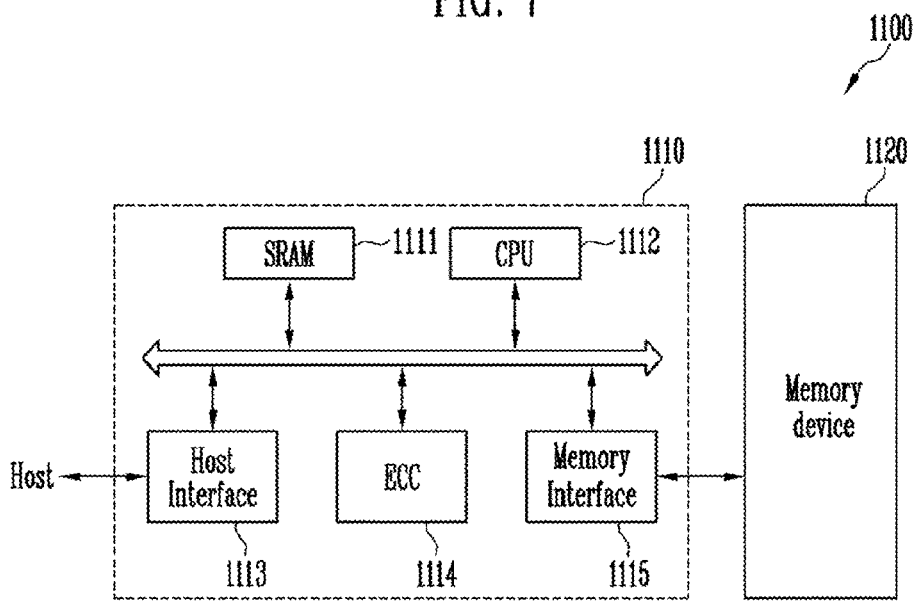
FIG. 7 is a diagram illustrating a configuration of a memory system according to an embodiment of the present disclosure.

FIG. 7 is a diagram illustrating a configuration of a memory system according to an embodiment of the present disclosure.

Referring to FIG. 7, the memory system 1100 according to the embodiment of the present disclosure includes a memory device 1120 and a memory controller 1110.

The memory device 1120 may include channel pillars having the structures described in FIGS. 2A to 2D. Also, memory device 1120 may be a multi-chip package formed of a plurality of flash memory chips.

The memory controller 1110 may control the memory device 1120, and may include a static random access memory (SRAM) 1111, a CPU 1112, a host interface 1113, an error correction code (ECC) 1114, and a memory interface 1115. The SRAM 1111 may be used as an operation memory of the CPU 1112. The CPU 1112 may perform control operations for data exchange of the memory controller 1110. The host interface 1113 may include a data exchange protocol for a host connected to the memory system 1100. The ECC 1114 may detect and correct an error included in a data read from the memory device 1120. The memory interface 1115 may provide an interface between the memory device 1120 and another device. In addition, the memory controller 1110 may further include a read only memory (ROM) for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1100 may communicate with an external device or an user (e.g., the host) through one of various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 8:
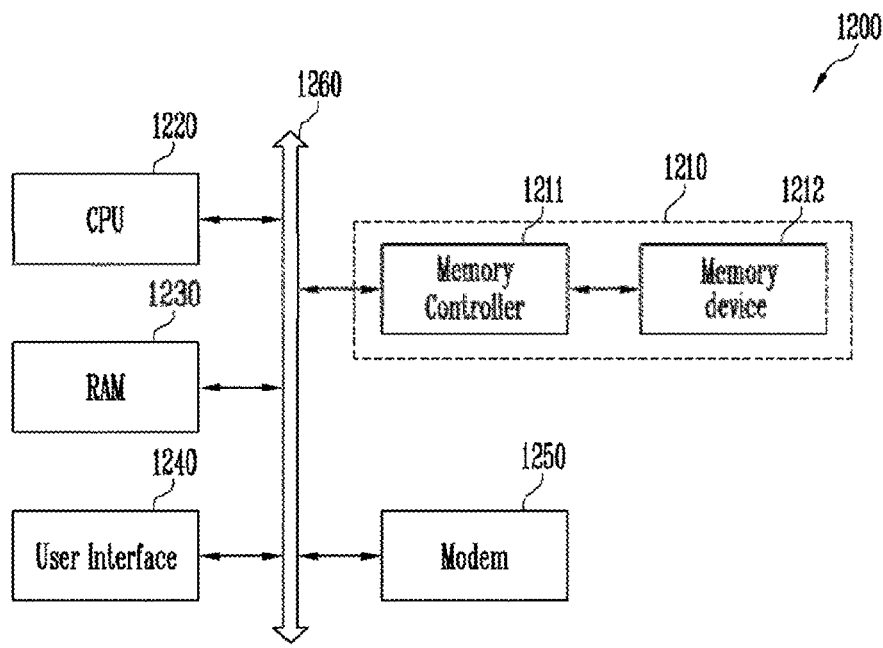
FIG. 8 is a diagram illustrating a configuration of a computing system according to an embodiment of the present disclosure.

FIG. 8 is a diagram illustrating a configuration of a computing system according to an embodiment of the present disclosure.

Referring to FIG. 8, the computing system 1200 according to an embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 7, may include a memory device 1212 and a memory controller 1211.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A semiconductor device comprising:
a multi-layered source layer including a lower source layer, an interlayer source layer, and an upper source layer;
conductive patterns and interlayer insulating layers alternately disposed on the multi-layered source layer; and
a channel pillar penetrating the conductive patterns, the interlayer insulating layers, the upper source layer, and the interlayer source layer, the channel pillar extending into the lower source layer, the channel pillar being in contact with the interlayer source layer, wherein the channel pillar includes a first doped region, which includes a first dopant and overlap the interlayer source layer, and a second doped region, which includes a second dopant and overlap at least one layer from the lowermost layer among the conductive patterns.

2. The semiconductor device of claim 1, wherein the first dopant is of an N type and the second dopant is of a P type.

3. The semiconductor device of claim 1, wherein the interlayer source layer includes a lower region including the first dopant and an upper region including the second dopant.

4. The semiconductor device of claim 1, wherein the lower source layer includes the first dopant, and the upper source layer includes the second dopant.

5. The semiconductor device of claim 1, wherein the channel pillar further includes a memory cell channel region disposed over the second doped region, and a threshold voltage of the second doped region is higher than that of the memory cell channel region.

6. A semiconductor device comprising:
 a multi-layered source layer including a stack structure of a lower source layer, an interlayer source layer, and an upper source layer;
 conductive patterns and interlayer insulating layers alternately disposed on the multi-layered source layer; and
 a channel pillar penetrating the conductive patterns, the interlayer insulating layers, the upper source layer, and the interlayer source layer, the channel pillar extending into the lower source layer, the channel pillar being in contact with the interlayer source layer,
 wherein the channel pillar includes a doped region overlapping the interlayer source layer and at least one layer from the lowermost layer among the conductive patterns, and a memory cell channel region disposed over the doped region and having a lower threshold voltage than the doped region.

7. The semiconductor device of claim 6, wherein the doped region includes a P-type dopant.

8. The semiconductor device of claim 7, wherein the interlayer source layer includes the P-type dopant, and the lower and upper source layers include an N-type dopant.

9. The semiconductor device of claim 7, wherein at least one of the lower source layer, the interlayer source layer, and the upper source layer includes the N-type dopant.

* * * * *